United States Patent
Posser et al.

(10) Patent No.: US 10,885,257 B1
(45) Date of Patent: Jan. 5, 2021

(54) ROUTING CONGESTION BASED ON VIA SPACING AND PIN DENSITY

(71) Applicant: Cadence Design Systems, Inc., San Jose, CA (US)

(72) Inventors: Gracieli Posser, Austin, TX (US); Wing-Kai Chow, Austin, TX (US); Mehmet Can Yildiz, Austin, TX (US); Zhuo Li, Austin, TX (US)

(73) Assignee: Cadence Design Systems, Inc., San Jose, CA (US)

( * ) Notice: Subject to any disclaimer, the term of this patent is extended or adjusted under 35 U.S.C. 154(b) by 81 days.

(21) Appl. No.: 16/384,689

(22) Filed: Apr. 15, 2019

(51) Int. Cl.
*G06F 30/30* (2020.01)
*G06F 30/394* (2020.01)
*G06F 30/398* (2020.01)
*G06F 30/392* (2020.01)

(52) U.S. Cl.
CPC .......... *G06F 30/394* (2020.01); *G06F 30/398* (2020.01); *G06F 30/392* (2020.01)

(58) Field of Classification Search
CPC ..... G06F 30/394; G06F 30/398; G06F 30/392
USPC .......................................................... 716/126
See application file for complete search history.

(56) References Cited

U.S. PATENT DOCUMENTS

| | | | | |
|---|---|---|---|---|
| 5,847,965 A * | 12/1998 | Cheng | ................... | G06F 30/392 716/123 |
| 7,984,397 B2 * | 7/2011 | Lin | ......................... | G06F 30/39 716/100 |
| 8,930,873 B1 * | 1/2015 | Alpert | ................... | G06F 30/398 716/130 |
| 9,003,344 B2 * | 4/2015 | Kennedy | ............... | G06F 30/398 716/110 |
| 9,613,176 B2 * | 4/2017 | Tai | ........................ | G06F 30/394 |

* cited by examiner

*Primary Examiner* — Jack Chiang
*Assistant Examiner* — Brandon Bowers
(74) *Attorney, Agent, or Firm* — Schwegman Lundberg & Woessner, P.A.

(57) ABSTRACT

Various embodiments provide for routing a network of a circuit design based on at least one of via spacing or pin density. For instance, some embodiments route a net of a circuit design (e.g., data nets, clock nets) by generating a congestion map based on modeling via spacing, modeling pin density, or some combination of both.

14 Claims, 12 Drawing Sheets

ROUTING CONGESTION BASED ON VIA SPACING AND PIN DENSITY

TECHNICAL FIELD

Embodiments described herein relate to circuit design and, more particularly, to systems, methods, devices, and instructions for routing a net of a circuit design based on at least one of via spacing or pin density, which may be part of electronic design automation (EDA).

BACKGROUND

Electronic design automation (EDA) software systems commonly perform routing of networks of circuit designs, such as clock networks (hereafter, clock nets). Usually, a network of a circuit design comprises a set of pins, and a routing process can route a path to connect the network. Net routing can be performed in two phases, where the first phase involves routing guides (e.g., global routing paths) that attempt to generate timing-aware/timing-based global routing of nets, and the second phase involves detailed routing of nets with specific wires (e.g., metal traces) based on the routing guides, while attempting to resolve/avoid one or more design rule violations.

Global routing can comprise two-dimensional (2D) net routing, layer assignment of wires of nets, or track assignment of wires of nets. Resolving congestion and major design rule constraints (DRCs) during global routing can facilitate detailed routing of nets. Conventional global routing can route nets of a circuit design by dividing the circuit design (e.g., each layer of the circuit design) into a grid of cells (also referred to as "global routing cells," "grid cell," or "g-cells"), where each grid cell comprises a set number of resources (e.g., horizontal and vertical resources, such as tracks) for routing a net, referred to as capacity, and a number of resources that are currently being used or demanded by global routing to route a network, referred to as demand. A cell can be square or rectangular in shape. Overflow for a given grid cell is usually determined by subtracting the demand for the given grid from the capacity of the given grid, where an overflow comprising a negative number indicates more demand for routing resources than available capacity of resources. A grid cell can be considered congested if the number of resources of the grid cell is less than what is needed to route a network through the grid cell, which is indicated by a negative number for overflow.

Based on the grid of cells, global routing can route a net of the circuit design by assigning the net to a set of specific grid cells and a set of specific layers (metal layers) of the circuit design. Generally, using grid cells permits global routing to speed up the process of finding the net routing solutions by analyzing routing congestion based on grid cell congestion and by reducing the number of pathways to consider for net routing.

BRIEF DESCRIPTION OF THE DRAWINGS

Various ones of the appended drawings merely illustrate various embodiments of the present disclosure and should not be considered as limiting its scope.

DETAILED DESCRIPTION

Figure 1:
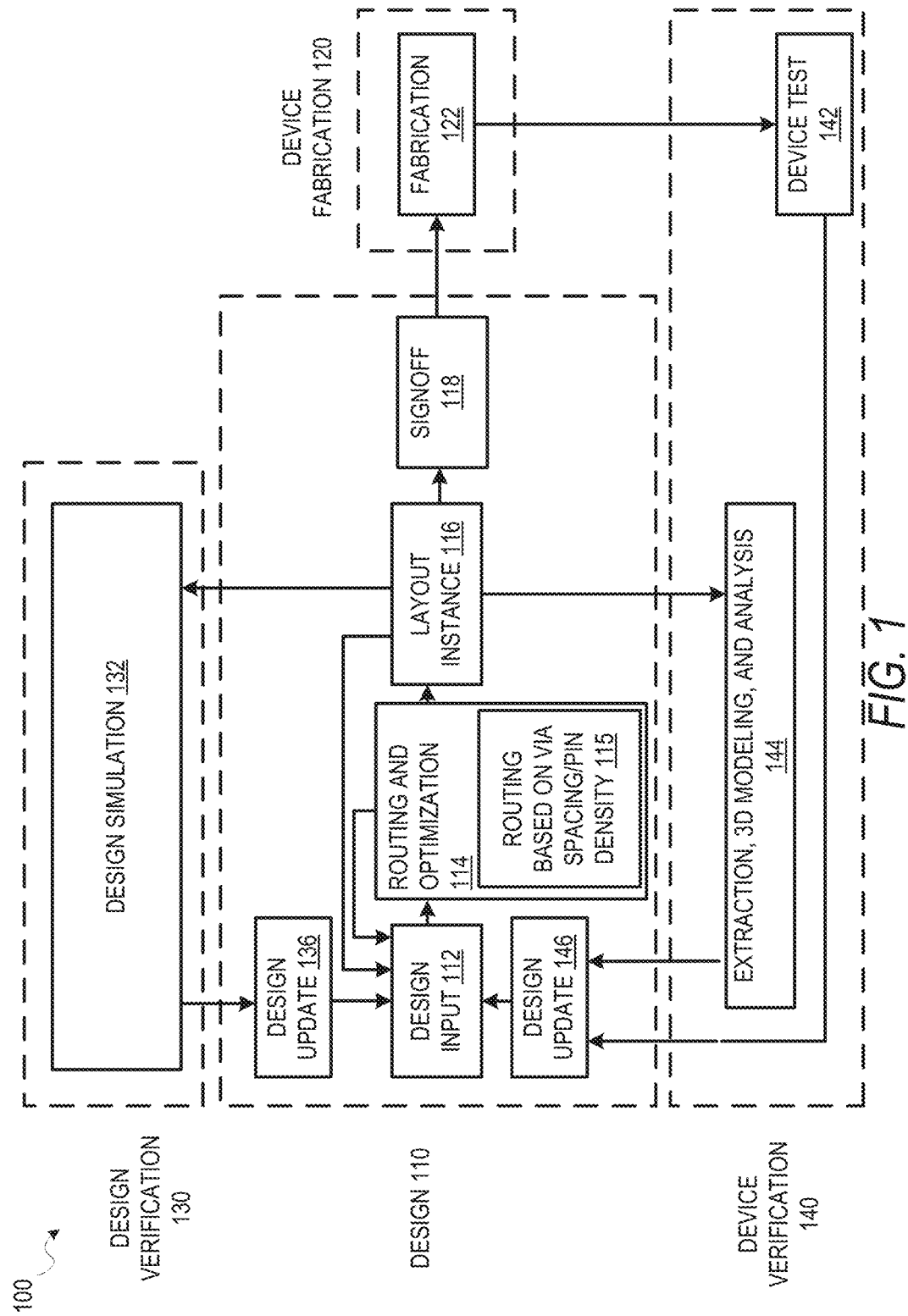
FIG. 1 is a diagram illustrating an example design process flow for routing a network of a circuit design based on at least one of via spacing or pin density, according to some embodiments.

Various embodiments provide for routing a network (net) of a circuit design based on at least one of via spacing or pin density. More particularly, some embodiments route a net of a circuit design (e.g., clock net, data net) by generating a congestion map based on modeling via spacing, modeling pin density, or some combination of both.

For instance, some embodiments described herein: can model via capacity with respect to one or more grid cells between one or more layers of a circuit design; can model via demand in a grid cell on a layer of a circuit design based on one or more via spacing rules (e.g., cut spacing rules); can estimate a maximum number of vias that a grid cell can accommodate; can report or detect routing congestion in one or more grid cells caused by vias (e.g., based on a number of vias in a grid cell and a via number threshold associated with the grid cell); and can enable circuit design routing (e.g., global routing) to be better aware of via spacing rules.

According to some embodiments, a count of vias, for each of one or more grid cells (e.g., all grid cells) on each of one or more layers all layers) of a circuit design, is generated. In view of the counts of vias for the one or more grid cells, a resource penalty demand can be added to each of the one or more grid cells that has extra vias (e.g., extra in view of a threshold number of vias). Subsequently, a congestion map for the circuit design can be generated based on resulting demands of the grid cells of the circuit design.

For some embodiments, via capacity between two grid cells on two different routing layers of a circuit design is modeled as a number of intersections formed by the two sets of tracks in each grid cell in different directions (e.g., a horizontal track and a vertical track for each grid cell). This number of intersections can model vias for a grid cell given that each via connects two routing layers. According to some embodiments, routing resource demand (hereafter, demand) of a via with respect to a particular grid cell can be modeled (e.g., represented) as a number of intersections being blocked within the grid cell when the via is placed within the particular grid cell. Some embodiments determine if a particular intersection is blocked by a particular via based on a shape of the particular via, the distance between the interaction and the particular via, the via spacing rule (e.g., cut spacing rule), or some combination thereof. For some embodiments, a threshold number of vias for grid cells of a circuit design is determined based on a via spacing rule. For example, the threshold number of vias for a particular grid cell can be determined (e.g., calculated) by dividing the number of interactions available in a particular grid cell by intersections demanded (e.g., the number of intersections blocked or occupied) by a single via based on an applicable via spacing rule. The number of intersections blocked or occupied by a via can comprise the intersection where the via is located and neighboring intersections blocked due to a via spacing rule. For instance, where there are 95 interactions available, and a via (e.g., of a particular type, such as VIA3) blocks 25 intersections based on an applicable via spacing rule, the threshold number of vias is 3.8 (95 divided by 25). Additionally, for some embodiments, the threshold number of vias is further determined by applying a multiplier parameter to the result of dividing the number of interactions available in a particular grid cell by intersections demanded by a single via based on an applicable via spacing rule. The multiplier parameter can be one tuned by a user (e.g., EDA user).

Various embodiments determine whether the number of vias in a particular grid cell exceeds a threshold number associated with the particular grid cell. In response to the number of vias in a particular grid cell exceeding the threshold, the demand for the particular grid cell can be updated to reflect an occurrence of via congestion. For instance, the demand for the particular grid cell can be updated with additional demand, which can be represented by a numerical value.

Various embodiments described herein can enable circuit design routing (e.g., global routing) to be aware of via spacing rules and to consider via spacing rules in the early stages of circuit design routing (e.g., early stages of global routing) so that placement processes can spread out via placement in regions where via spacing is causing congestion, Various embodiments can enable detection of grid cell congestion with improved accuracy. In doing so, various embodiments can improve a computer system's ability to perform global routing, and can reduce congestion and design violation that result at the end of global routing. Various embodiments described herein represent an improvement over conventional circuit design routing (e.g., global routing) techniques, which typically do not consider via spacing rules, which would have difficulty handling via spacing rules using design rules, and which generally model resource consumption by vias as a number of tracks being blocked for the length of a grid cell (thereby failing to accurately account for irregular regions that can be blocked by a via).

Some embodiments described herein can be used to model complicated via spacing rules (e.g., 2 by 2 intersection spacing, or 1 by 3 intersection spacing) into congestion maps, such as via spacing rules for one or more vias available in the design, which can be important for routability of a circuit design.

With respect to pin density; during circuit design routing, pin shapes in a grid cell can be disposed in the same layer of circuit design that circuit design routing (e.g., global routing) is permitted to use for routing, and this can cause congestion in grid cells. Various embodiments described herein: can model pin shapes within one or more grid cells, disposed on one or more routable layers of a circuit design, based on pin density; can ensure a minimum capacity for a grid cell in a routable layer of a circuit design; can report or detect routing congestion in one or more grid cells caused by pin density; and can enable circuit design routing (e.g., global routing) to be better aware of via spacing rules.

According to some embodiments, one or more pins (e.g., all pins) of a circuit design are analyzed. During analysis, in response to a given pin being disposed on a given routable layer of the circuit design, location of a given grid cell containing the given pin can be obtained and a counter associated with the given grid cell (based on the location of the given grid cell) can be adjusted (e.g., incremented) for the given routable layer. In this way, a count map can be generated to indicate how many pins there are for each grid cell on each routable layer of the circuit design. Thereafter, each grid cell on a routable layer can be analyzed to determine a count of pins (e.g., pin shapes) that are in each grid cell, and extra resource demand can be added to a given grid cell based on its corresponding pin count, thereby reducing the resource capacity for the given grid cell. In response to a pin count of a given grid cell (on a particular routable layer) being higher than a threshold number of pins, the given grid cell can be determined to be totally blocked (e.g., there is no capacity available for the circuit design router). Subsequently, a congestion map for the circuit design can be generated based on resulting demands of the grid cells of the circuit design.

Various embodiments described herein can enable circuit design routing (e.g., global routing) to be aware of pin density and to consider pin density in early stages of circuit design routing (e.g., early stages of global routing) so that placement processes can better detect congestion in grid cells caused by high pin density (e.g., on a mutable layer) and can spread out pin placement in such congested regions. Various embodiments described herein represent an improvement over conventional circuit design routing (e.g., global routing) techniques, which typically do not consider pin shapes in modeling capacity of grid cells, and which would have difficulty handling pin shapes using demand modeling (since demand could continuously be added into a grid cell). By not considering pin shapes early (e.g., during global routing), conventional circuit design routing can end up with an inaccurate understanding about congestion and resources available in a grid cell during global routing, which in turn can cause a mismatch in routability of grid cells between global routing and detailed routing. Based on this mismatch, detailed routing for conventional circuit design routing will cause DRC violations that could otherwise be avoided (e.g., by use of an embodiment described herein).

In contrast, by considering pin shapes in modeling capacity of grid cells, various embodiments described herein can block grid cell(s) by way of the capacity modeling, thereby causing circuit design routing to avoid routing through those blocked grid cell(s). Use of various embodiments described herein for pin density modeling can achieve Quality of Result (QoR), and can converge to a routing solution faster and more easily (e.g., based on placement being able to spread grid cells with pins and get a better routability picture) than conventional circuit design routing techniques.

Depending on the embodiment, modeling routing congestion based on via spacing, pin density, or both (as described herein) can be performed as part of global routing and prior to detailed routing.

As used herein, global routing can comprise determining a routing plan (e.g., one or more routing guides) for routing a physical wire (e.g., interconnect line or wire) within a circuit design between two or more nodes of the circuit design (e.g., two pins or a source and a pin). For instance, global routing can route a wire (of a net of the circuit design) within the circuit design by dividing the circuit design (e.g., dividing each of one or more layers of the circuit design)

into a grid of cells (e.g., grid cells), where each cell comprises a set number of resources (e.g., horizontal and vertical resources, such as tracks) for routing the wire. For some embodiments, each layer of a circuit design comprises its own grid of cells (e.g., grid cells). Additionally, for some embodiments, a routing blockage of a circuit design (e.g., on a layer of the circuit design) is marked with respect to a cell (e.g., grid cell) in the grid. Global routing can consider/account for one or more routing blockages of the circuit design when determining a route plan for a wire within the circuit design.

Global routing can route a wire (of the net) by assigning the net to a set of specific cells and a set of specific layers (metal layers) of the circuit design. In doing so, global routing can generate a routing plan for the wire that describes a set of connected cells (e.g., grid cells), between two or more nodes of the circuit design, that does not include obstructed cells. The routing plan (e.g., global routing plan) can comprise one or more routing guides that serve as "loose" routing paths or routing areas within which detailed routing can route a physical wire between two or more nodes (e.g., pins) of a circuit design.

As used herein, a routing blockage (or routing obstacle) can comprise a defined area of a circuit design that serves as an obstruction with respect to routing (e.g., routing a wire associated with a network of the circuit design, such as a clock net) through the defined area. For example, a routing blockage can be caused by a macro block included by a circuit design, which may be associated with a circuit design intellectual property (IP) block, A given routing blockage can comprise an area covering one or more layers of a circuit design (e.g., layers M1, M2, and M3). For various embodiments, circuit design routing routes a wire around a routing blockage.

As used herein, detailed routing can comprise routing a physical wire (e.g., interconnect wire) within a circuit design, between two or more nodes of the circuit design, based on a routing plan determined by global routing for the circuit design. The routing plan can provide a detailed routing process with a topology for routing wires, which in turn can enable detailed routing to route wires without violating one or more design rule constraints (DRCs) associated with a circuit design. This can be referred to as detailed routing being performed with clean DRCs. Accordingly, for some embodiments, global routing is performed on a circuit design prior to detailed routing being performed on the circuit design. Generally, global routing can be performed on a circuit design faster than performing detailed routing on the same circuit design. The routed wires of a circuit design can form a network of the circuit design.

As used herein, a via spacing rule (e.g., cut spacing rule) for vias can comprise a rule that defines extra spacing between a via and another circuit element, such as another via. A via spacing rule can be associated or applied to a single layer of a circuit design, or to a plurality of layers of a circuit design.

As used herein, a congestion map can describe a measure (e.g., estimated measure) of routing congestion for a set of grid cells on layer(s) (e.g., metal layers) of a circuit design, where the layers serve as interconnect structures for the circuit design. A measure of routing congestion for a given grid cell can be represented by one or more congestion ratios, such as one ratio for a horizontal routing resource and another ratio for a vertical routing resource. For example, a congestion ratio for a horizontal routing resource of a given grid can comprise a total number of horizontal routing resources demanded from the given grid cell by circuit elements (e.g., logical devices of the circuit design) within the given grid cell, divided by a total number of horizontal routing resources available (supplied) by the given grid cell. A congestion map can be implemented as a data structure, such as a two-dimensional array, for storing measured interconnect congestion for individual cells of the set of grid cells.

As used herein, a capacity map can describe a measure of routing resource capacity of a set of grid cells for layer(s) of a circuit design, such as horizontal and vertical resources (e.g., tracks) for routing a wire through each grid cell. For some embodiments, a capacity map is used by global routing to generate a set of routing guides between at least two nodes of the circuit design (e.g., between two pins or between a source and a pin). A capacity map for a circuit design can be generated based on a congestion map. As used herein, via capacity for a given grid cell can describe a capacity available in the given grid cell for vias.

Reference will now be made in detail to embodiments of the present disclosure, examples of which are illustrated in the appended drawings. The present disclosure may, however, be embodied in many different forms and should not be construed as being limited to the embodiments set forth herein.

FIG. 1 is a diagram illustrating an example design process flow 100 for routing a network of a circuit design based on at least one of via spacing or pin density, according to some embodiments. As shown, the design process flow 100 includes a design phase 110, a device fabrication phase 120, a design verification phase 130, and a device verification phase 140. The design phase 110 involves an initial design input 112 operation where the basic elements and functionality of a device are determined, as well as revisions based on various analyses and optimizations of a circuit design. This design input 112 operation is where block instances are used in the circuit design and any additional circuitry for the design around the blocks is selected. The initial strategy, tactics, and context for the device to be created are also generated in the design input 112 operation, depending on the particular design algorithm to be used.

In some embodiments, following an initial selection of design values in the design input 112 operation, routing, timing analysis, and optimization are performed in a routing and optimization 114 operation, along with any other automated design processes. The routing and optimization 114 operation may also include other operations not shown, such as those relating to floor planning, placement, post-placement optimization, and post-routing optimization. As shown, the routing and optimization 114 operation includes a (circuit design) routing based on via spacing/pin density operation 115, which may be performed in accordance with various embodiments described herein. For some embodiments, operation 115 can be performed prior to detailed routing of a circuit design and, more particularly; during (e.g., as part of) global routing of the circuit design.

While the design process flow 100 shows optimization occurring prior to a layout instance 116, timing analysis and optimization may be performed at any time to verify operation of a circuit design. For instance, in various embodiments; timing analysis in a circuit design may be performed prior to routing of connections in the circuit design, after routing, during register transfer level (RTL) operations, or as part of a signoff 118; as described below.

Design inputs are used in the design input 112 operation to generate an initial circuit layout. The design inputs may be further processed during the design input 112 operation via a process, such as logic-synthesis, to generate a circuit netlist mapped to a target standard library manufacturable by the foundry in fabrication 122 operation, After design inputs are used in the design input 112 operation to generate an initial circuit layout, and any of the routing and optimization 114 operations are performed, a resulting layout is generated as the layout instance 116. The netlist as placed by the layout instance 116 describes the physical layout dimensions of the device that match the design inputs. Prior to this layout being provided to a fabrication 122 operation, the signoff 118 is performed on the circuit design defined by the layout.

After signoff verification by the signoff 118, a verified version of the layout is used in the fabrication 122 operation to generate a device, or additional testing and design updates may be performed using designer inputs or automated updates based on design simulation 132 operations or extraction, 3D modeling, and analysis 144 operations. Once the device is generated, the device can be tested as part of device test 142 operations, and layout modifications generated based on actual device performance.

As described in more detail below, a design update 136 from the design simulation 132; a design update 146 from the device test 142 or the extraction, 3D modeling, and analysis 144 operations; or the design input 112 operation may occur after the initial layout instance 116 is generated. In various embodiments, whenever design inputs are used to update or change an aspect of a circuit design, a timing analysis and the routing and optimization 114 operation may be performed.

Figure 2:
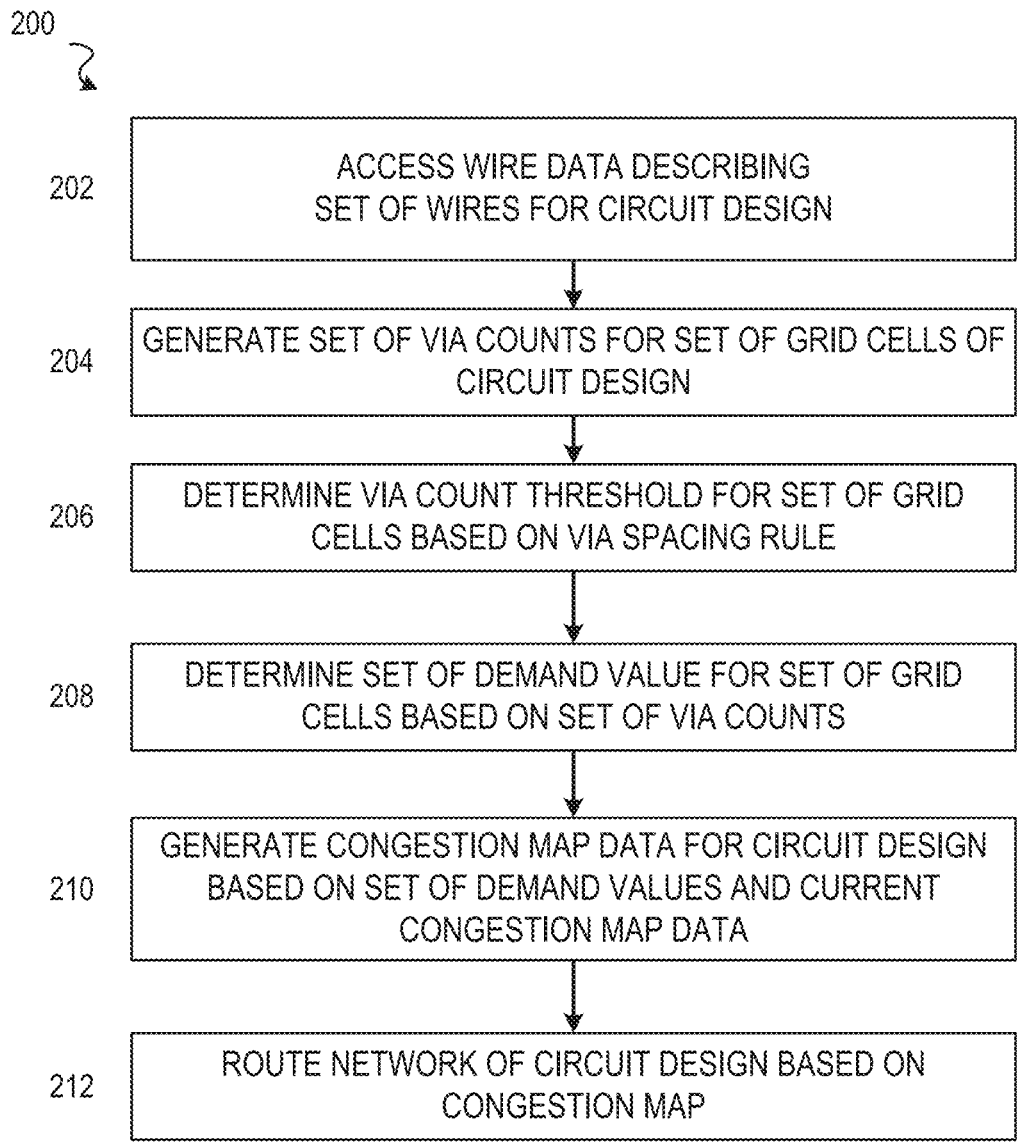
FIGS. 2 through 4 are flowcharts illustrating example methods for routing a network of a circuit design based on via spacing, according to some embodiments.
Figure 3:
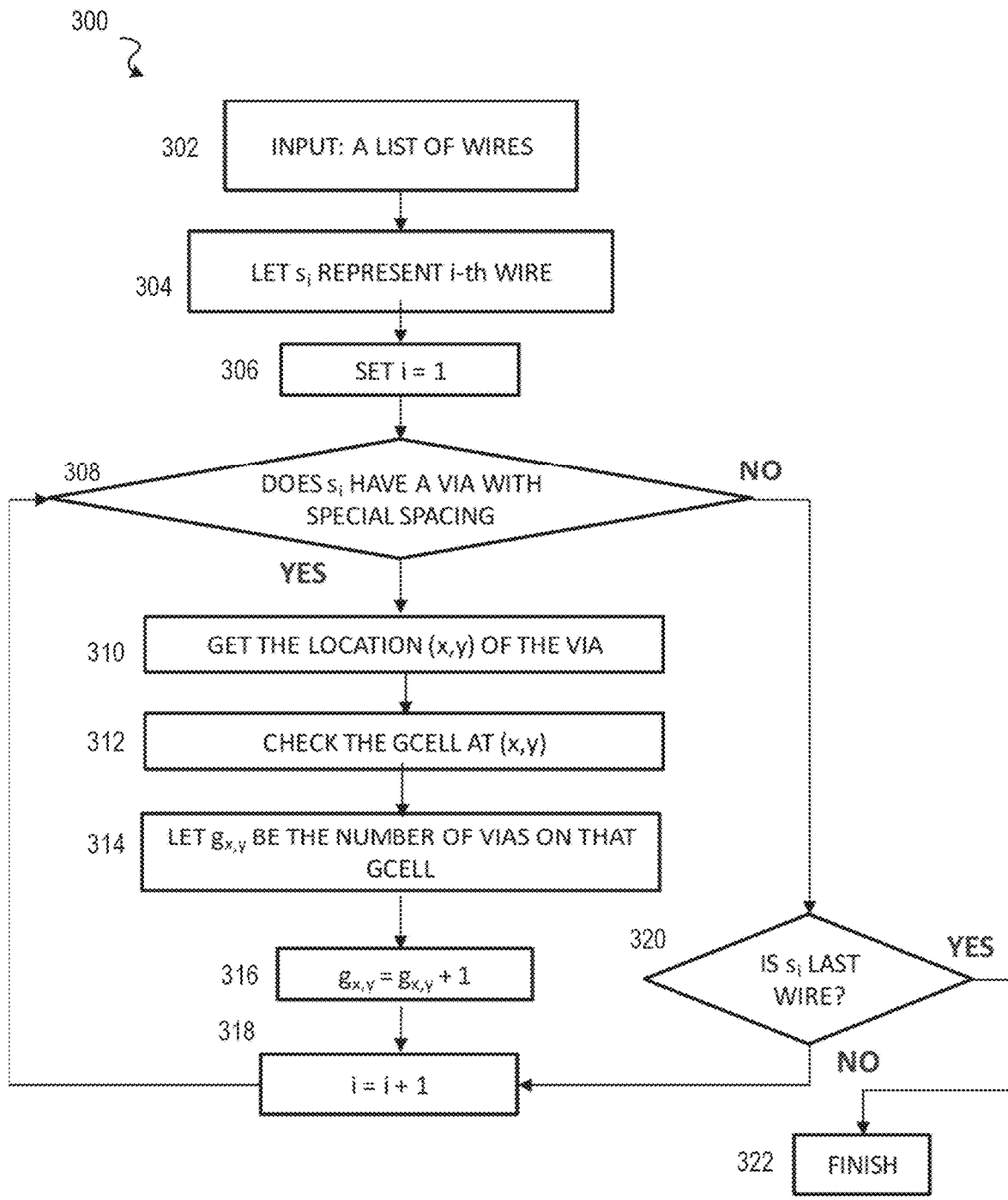
Figure 4:
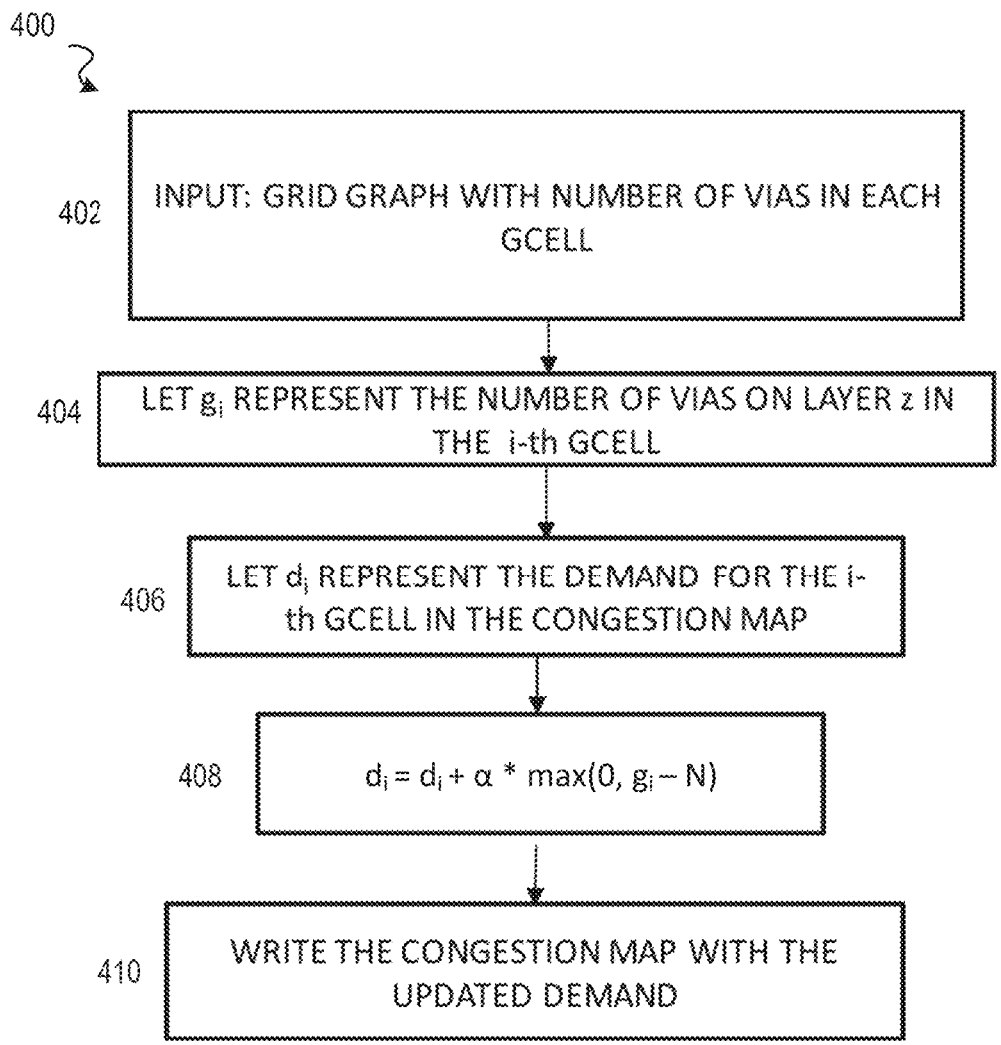

FIGS. 2 through 4 are flowcharts illustrating example methods for routing a network of a circuit design based on via spacing, according to some embodiments. It will be understood that example methods described herein may be performed by a device, such as a computing device executing instructions of an EDA software system, in accordance with some embodiments. Additionally, example methods described herein may be implemented in the form of executable instructions stored on a computer-readable medium or in the form of electronic circuitry. For instance, the operations of a method 200 of FIG. 2 may be represented by executable instructions that, when executed by a processor of a computing device, cause the computing device to perform the method 200. Depending on the embodiment, an operation of an example method described herein may be repeated in different ways or involve intervening operations not shown. Though the operations of example methods may be depicted and described in a certain order, the order in which the operations are performed may vary among embodiments, including performing certain operations in parallel.

Referring now to FIG. 2, the flowchart illustrates the example method 200 for routing a network of a circuit design based on via spacing, according to some embodiments. For some embodiments, the method 200 is performed as part of a global routing process with respect to a circuit design (e.g., by an EDA software system). An operation of the method 200 (or another method described herein) may be performed by a hardware processor (e.g., central processing unit or graphics processing unit) of a computing device (e.g., desktop, server, etc.).

The method 200 as illustrated begins with operation 202 accessing wiring data that describes a set of wires for a circuit design. The wiring data can include, without limitation, one or more of grid cell location, layer location, and track assignment of a via. Additionally, the wiring data can describe (or at least indicate the locations) of a set of vias for the set of wires. For instance, the wiring data can describe the vias by include one or more vias of the circuit design as part of the set of wires described, or the wiring data can indicate where vias will be needed from one layer to another layer of the circuit design.

The method 200 continues with operation 204 generating a set of via counts that corresponds to a set of grid cells for the circuit design, where the set of grid cells can be disposed on one or more layers (e.g., all layers) of the circuit design. Depending on the embodiment, the set of grid cells can comprise only those grid cells disposed on one or more layers of the circuit design that are associated with a via spacing rule. For some embodiments, generating the set of via counts comprises determining, based on the wiring data, a count of vias in each grid cell of the set of grid cells. For some embodiments, some or all of operation 204 is performed similar to method 300 of FIG. 3 as described herein.

The method 200 continues with operation 206 determining a via count threshold for each grid cell in the set of grid cells based on a via spacing rule. Depending on the embodiment, a via spacing rule can be applicable to only one or more particular types of vias (e.g., VIA3) present in the circuit design and, as such, only vias of those particular types (e.g., ones having special spacing requirements based on an applicable via spacing rule) are considered by the method 200 (e.g., counted by operation 204). Additionally, different types of vias can have different via spacing rules. For some embodiments, the grid cells in the set of grid cells are uniform and a via count threshold determined for a single grid cell of the set of grid cells is applicable to (e.g., shared by) all grid cells in the set of grid cells. Additionally, for some embodiments, determining the via count threshold for each grid cell in the set of grid cells based on the via spacing rule comprises determining a number of available intersections in each grid cell in the set of grid cells and determining a number of blocked intersections per a via based on the via spacing rule; the via count threshold can then be determined based on the number of available intersections and the number of blocked intersections. In particular, determining the via count threshold based on the number of available intersections and the number of blocked intersections can comprise dividing the available intersections by the number of blocked intersections. As noted herein, the grid cells can be uniform and, as such, the number of available intersections in each grid cell in the set of grid cells could be the same. Accordingly, for some embodiments, the determining the via count threshold for each grid cell in the set of grid cells based on the via spacing rule is performed only once (with respect to a single grid cell).

The method 200 continues with operation 208 determining a set of demand values that corresponds to the set of grid cells based on the set of via counts (generated at operation 204) and the via count threshold (determined at operation 206). According to various embodiments, a given demand value, in the set of demand values, corresponds to a given grid cell in the set of grid cells, and the given demand value represents an additional resource demand value caused by one or more vias in the given grid cell. For some embodiments, the set of via counts in view of the via count threshold facilitates modeling a via spacing rule for individual grid cells. The set of demand values can represent additional resource demands that result from (e.g., demand penalties generated by) modeling the via spacing rule for the individual grid cells, and that can be applied to corresponding grid cells as described herein. Determining the set of demand values corresponding to the set of grid cells based on the set of via counts and the via count threshold can comprise determining a given demand value (in the set of demand values) for a given grid cell (in the set of grid cells)

by subtracting the via count threshold from a via count (in the via counts) corresponding to the given grid cell. This determination can be performed with respect to a plurality of grid cells (e.g., all the grid cells) in the set of grid cells.

The method 200 continues with operation 210 generating congestion map data for the circuit design based on the set of demand values (determined at operation 208), where the congestion map data can describe routing congestion for the set of grid cells. For some embodiments, generating the congestion map data based on the set of demand values comprises accessing prior congestion map data for the set of grid cells (e.g., congestion map data generated using conventional techniques), and generating the congestion map by updating the prior congestion map data based on the set of demand values. Updating the prior congestion map data based on the set of demand values can comprise adjusting existing demand values described in the prior congestion map data by a corresponding demand value from the set of demand values. In doing so, a demand penalty represented by the corresponding demand value can be applied to the existing demand value. For some embodiments, the prior congestion map data comprises data describing a set of existing (routing) demand values previously determined for the set of grid cells. In such embodiments, updating the prior congestion map data based on the set of demand values can comprise adding a value, based on a given demand value (in the set of demand values) for a given grid cell, to a given existing demand value (in the set of existing demand values) for the given grid cell to generate an updated demand value for the given grid cell.

For some embodiments, some or all of operations 208 and 210 are performed similar to method 400 of FIG. 4 as described herein.

The method 200 continues with operation 212 routing a network of the circuit design based on the congestion map data generated by operation 210. For some embodiments, routing the network of the circuit design based on the congestion map data comprises performing detailed routing on the circuit design based on the congestion map data.

Referring now to FIG. 3, the flowchart illustrates the example method 300 for generating a set of via counts that corresponds to a set of grid cells for a circuit design, according to some embodiments. In particular, the method 300 can count a number of vias having special spacing (e.g., associated with a via spacing rule) in each grid cell on a particular layer of the circuit design. For some embodiments, the method 300 is performed once for each different layer of the circuit design to count a number of vias (having special spacing) on those different layers of the circuit design. Like the method 200 of FIG. 2, the method 300 can be performed as part of a global routing process with respect to a circuit design (e.g., by an EDA software system). An operation of the method 300 may be performed by a hardware processor.

The method 300 as illustrated begins with operation 302 accessing a list of wires as input and, at operation 304, letting variable si represent the wire in the list of wires. The method 300 continues with operation 306 initially setting variable i to a value of 1. The method 300 continues with operation 308 determining whether the wire represented by s has a via with special spacing (e.g., one to which a via spacing rule applies). If yes, the method 300 continues to operation 310; otherwise the method 300 continues to operation 320. Operation 320 determines whether the wire represented by si is the last in the list of wires accessed at operation 302. If yes, the method 300 finishes at operation 322; otherwise the method 300 continues to operation 318 and goes back to operation 308.

If the method 300 continues to operation 310, a location (x and y coordinates) is obtained for the via (the via determined to have special spacing at operation 308) on a current layer of the circuit design. The method 300 continues with operation 312 checking a grid cell at the location obtained at operation 310. The method 300 continues with operation 314 letting variable $g_{x,y}$ be the number of vias in the grid cell at the location. The method 300 continues with operation 316 incrementing $g_{x,y}$ by a value of 1. The method 300 continues with operation 318 incrementing variable i by a value of 1. The method 300 then returns to operation 308.

Referring now to FIG. 4, the flowchart illustrates the example method 400 for determining a set of demand values (that corresponds to the set of grid cells) based on a set of via counts and a via count threshold, and for generating congestion map data for the circuit design based on the set of demand values; according to some embodiments. In particular, the method 400 can determine a given demand value (in the set of demand values) for the $i^{th}$ grid cell, and can update an existing demand value (from an existing congestion map) for the $i^{th}$ grid cell based on the given demand value to write a congestion map with an updated demand. For some embodiments, the method 400 is performed once for each via count in the set of via counts for a given layer z of the circuit design. Additionally, the method 400 can further be repeated for other layers of the circuit design. Like the method 200 of FIG. 2, the method 400 can be performed as part of a global routing process with respect to a circuit design (e.g., by an EDA software system). An operation of the method 400 may be performed by a hardware processor.

The method 400 as illustrated starts at operation 402 accessing a grid graph that lists the number of vias in each grid cell for one or more layers of a circuit design. The grid graph can represent the set of via counts described herein and, for some embodiments, can be generated by the method 300 described herein with respect to FIG. 3.

The method 400 continues with operation 404 letting variable $g_i$ represent the number of vias counted in the $i^{th}$ grid cell on layer z of the circuit design. The method 400 continues with operation 406 letting variable $d_i$ represent a demand (a prior or existing demand value) for the grid cell $g_i$ in an existing congestion map. The method 400 continues with operation 408 updating the demand $d_i$ by the following Equation 1, $$d_i = d_i + \alpha \times \max(0, (g_i - N)), (g_i - N),$$

where $\alpha$ represents a multiplier value that can be tuned by a user (e.g., EDA user) and N represents the via count threshold (e.g., the number of vias allowed in a grid cell). Eventually, the method 400 continues with operation 410 writing (e.g., generating) a congestion map with the demand updated at operation 408.

Figure 5A:
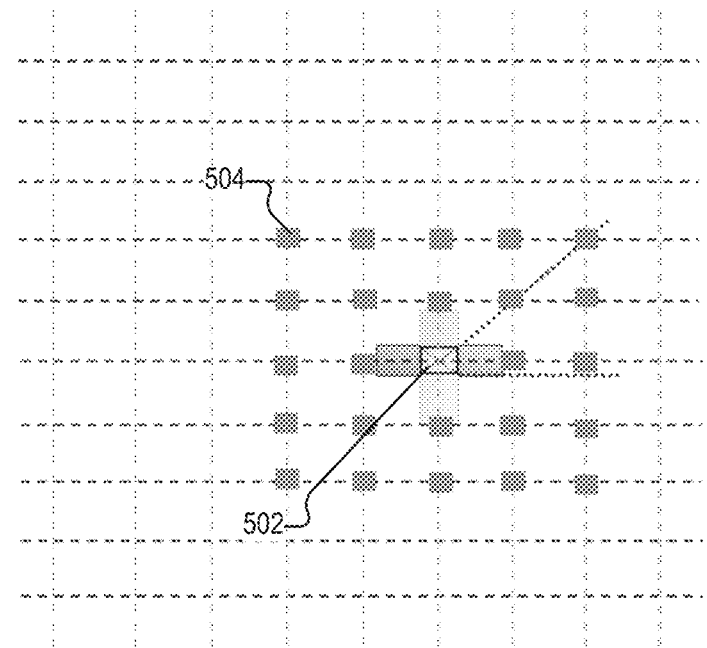
FIGS. 5A and 5B are diagrams illustrating an example grid cell that can be processed by some embodiments.
Figure 5A:
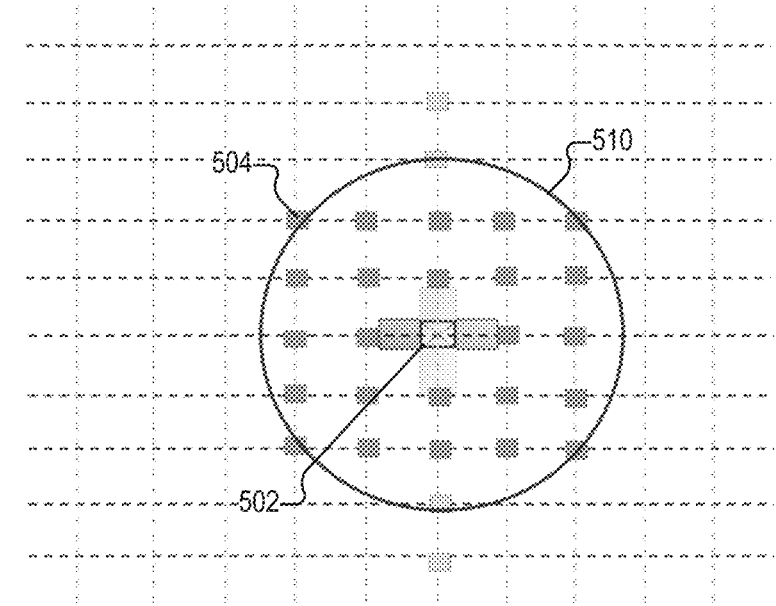
Figure 5B:
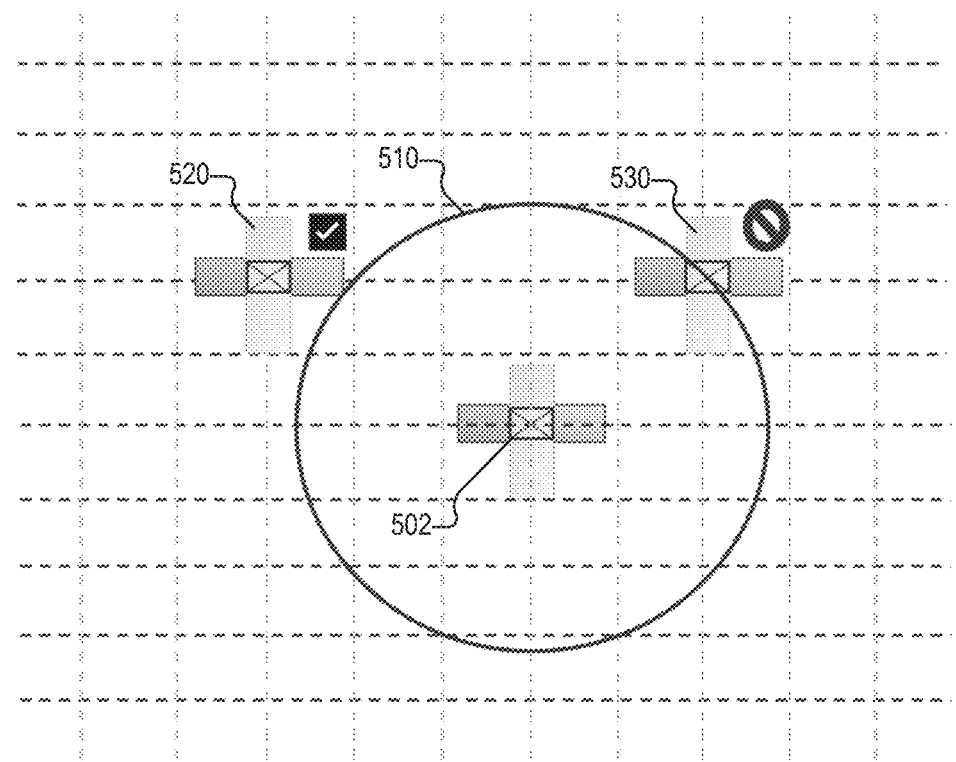

FIGS. 5A and 5B are diagrams illustrating an example grid cell 500 that can be processed by some embodiments, such as the method 200 of FIG. 2. In particular, 500A, 500B, 500C are representations of the grid cell 500 with respect to example intersection blockage and a violation of an example via spacing rule. As shown with respect to grid cell 500A, the grid cell 500A comprises a via 502 and multiple intersections (e.g., intersection 504) in proximity to the via 502. As shown with respect to grid cell 500B, circle 510 represents a via spacing rule (e.g., a cut spacing rule) applied relative to the via 502. Intersections falling within the circle 510, such as intersection 504, represent intersections blocked by the via 502 based on the via spacing rule. Accordingly, as shown with respect to grid cell 500C, via 520 is placed at a non-blocked intersection of the grid cell 500 and, as such, does not violate the via spacing rule (represented by the circle 510) with respect to the via 502. Via 530 on the other hand is located at an intersection blocked by the via 502 based on the via spacing rule and, as such, the via 530 is in violation of the via spacing rule (which would generally be detected during detailed routing). Various embodiments described herein can avoid the via spacing rule violation caused by the placement of the via 530 by considering the via spacing rule during circuit design routing (e.g., during global routing).

Figure 6:
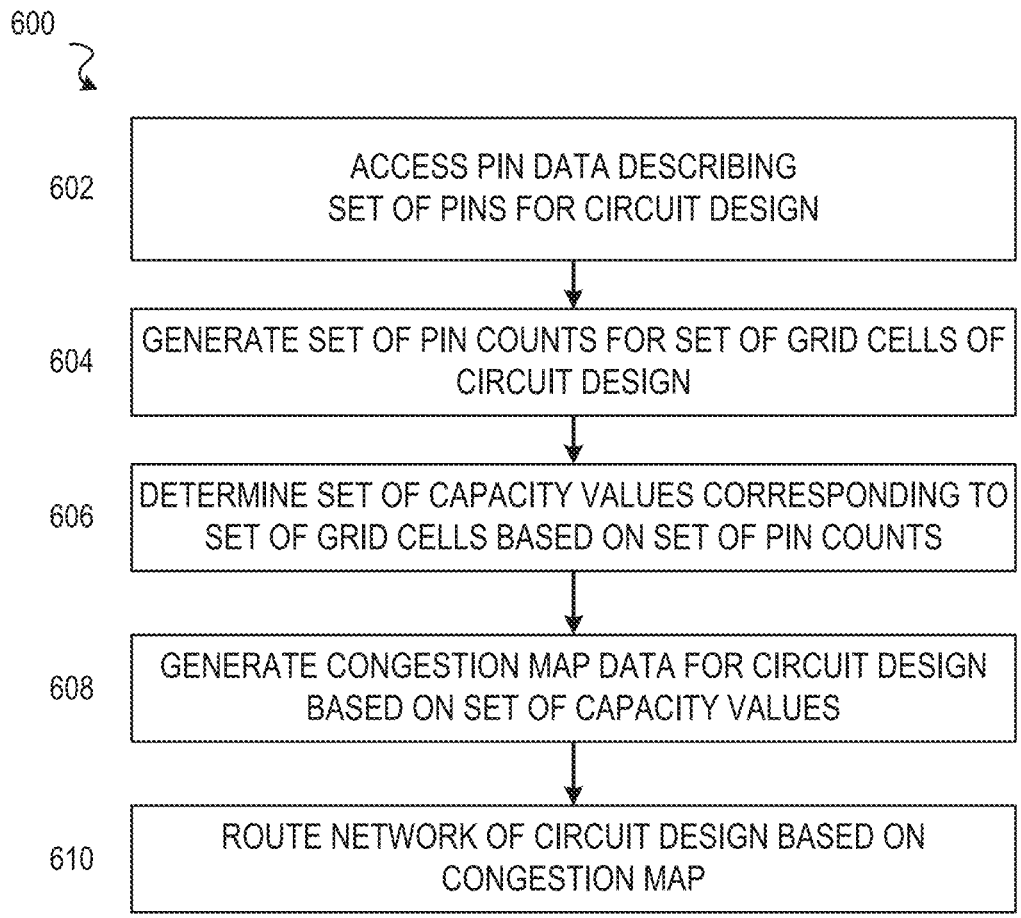
FIGS. 6 through 8 are flowcharts illustrating example methods for routing a network of a circuit design based on pin density, according to some embodiments.
Figure 7:
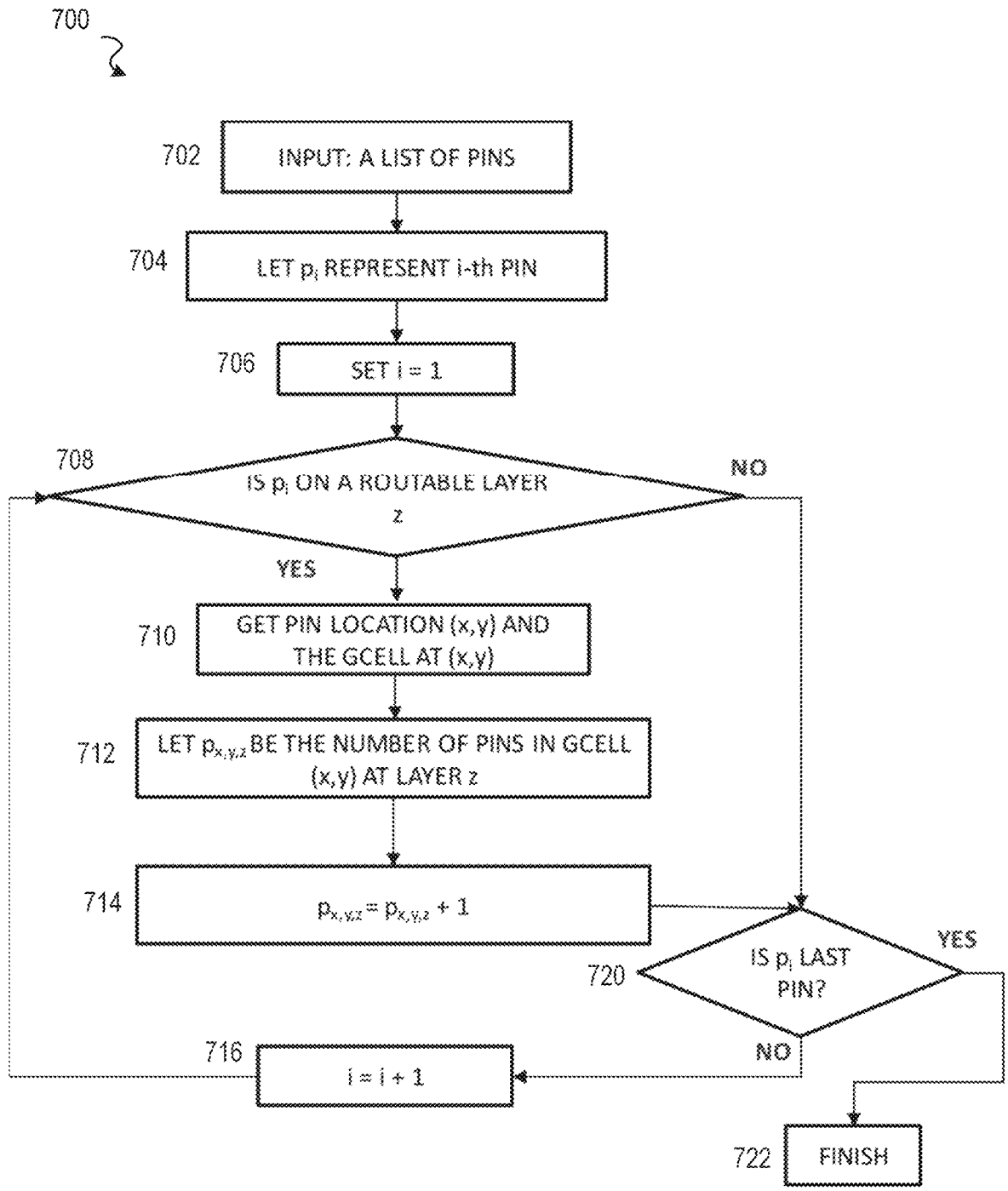
Figure 8:
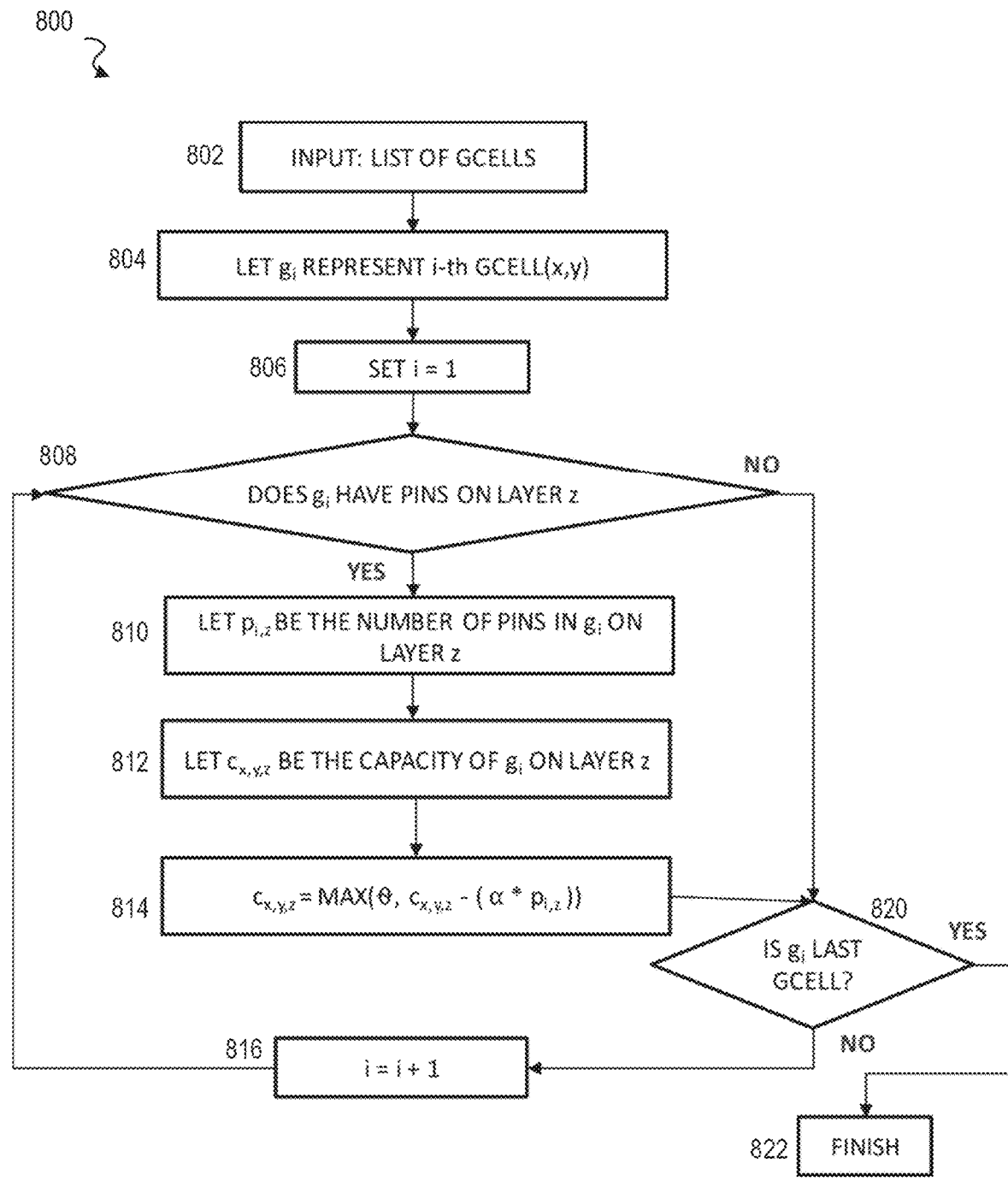

FIGS. 6 through 8 are flowcharts illustrating example methods for routing a network of a circuit design based on pin density, according to some embodiments. As noted herein, it will be understood that example methods described herein may be performed by a device, such as a computing device executing instructions of an EDA software system, in accordance with some embodiments. Additionally, example methods described herein may be implemented in the form of executable instructions stored on a computer-readable medium or in the form of electronic circuitry. Depending on the embodiment, an operation of an example method described herein may be repeated in different ways or involve intervening operations not shown. Though the operations of example methods may be depicted and described in a certain order, the order in which the operations are performed may vary among embodiments, including performing certain operations in parallel.

Referring now to FIG. 6, the flowchart illustrates the example method 600 for routing a network of a circuit design based on pin density, according to some embodiments. For some embodiments, the method 600 is performed as part of a global routing process with respect to a circuit design (e.g., by an EDA software system). An operation of the method 600 (or another method described herein) may be performed by a hardware processor (e.g., central processing unit or graphics processing unit) of a computing device (e.g., desktop, server, etc.).

The method 600 as illustrated begins with operation 602 accessing pin data that describes a set of pins for a circuit design. The pin data can include, without limitation, one or more of grid cell location, layer location, and track assignment of a pin.

The method 600 continues with operation 604 generating a set of pin counts that corresponds to a set of grid cells for the circuit design, where the set of grid cells can be disposed on one or more layers (e.g., all routable layers) of the circuit design. For some embodiments, generating the set of pin counts comprises determining a count of pins in each grid cell of the set of grid cells based on the pin data. Depending on the embodiment, the set of grid cells can comprise only those grid cells disposed on one or more routable layers of the circuit design. For some embodiments, generating the set of pin counts comprises determining, based on the pin data, a count of pins in each grid cell of the set of grid cells. For some embodiments, some or all of operation 604 is performed similar to method 700 of FIG. 7 as described herein.

The method 600 continues with operation 606 determining a set of capacity values that corresponds to the set of grid cells based on the set of pin counts (generated by operation 604) and a minimum capacity value for each grid cell in the set of grid cells. For some embodiments, a single minimum capacity value is applicable to all grid cells in the set of grid cells. Additionally, the minimum capacity value can be one determined by a user (e.g., EDA user). According to various embodiments, a given capacity value, in the set of capacity values, corresponds to a given grid cell in the set of grid cells, and the given capacity value represents an adjusted capacity based on additional resource demand caused by one or more pin density in the given grid cell. For some embodiments, the set of pin counts in view of the minimum capacity value facilitates modeling pin density for individual grid cells. The set of capacity values can represent adjusted capacities that result from modeling pin densities for the individual grid cells, and that can be applied to corresponding grid cells as described herein. According to some embodiments, the adjusted capacity of a grid cell can represent that the grid cell is blocked for routing purposes in view of the determining an intermediate capacity value by subtracting the pin count, in the via counts, corresponding to the given grid cell from a current capacity value of the given grid cell (e.g., the adjusted capacity reflects that the number of pins is higher than a given threshold). Determining the set of capacity values corresponding to the set of grid cells based on the set of pin counts and the minimum capacity value can comprise: determining an intermediate capacity value by subtracting the pin count, in the via counts, corresponding to a given grid cell (in the set of demand values) from a current capacity value of the given grid cell; and setting the given capacity value to a maximum of the minimum capacity value and intermediate capacity value. This determination can be performed with respect to a plurality of grid cells in the set of grid cells (e.g., all the grid cells on mutable layers). For some embodiments, some or all of operations 606 is performed similar to method 800 of FIG. 8 as described herein.

The method 600 continues with operation 608 generating congestion map data for the circuit design based on the set of capacity values (determined at operation 606), where the congestion map data can describe routing congestion for the set of grid cells.

The method 600 continues with operation 610 routing a network of the circuit design based on the congestion map data generated by operation 610. For some embodiments, routing the network of the circuit design based on the congestion map data comprises performing detailed routing on the circuit design based on the congestion map data.

Referring now to FIG. 7, the flowchart illustrates the example method 700 for generating a set of pin counts that corresponds to a set of grid cells for a circuit design, according to some embodiments. In particular, the method 700 can count a number of pins (e.g., pin shapes) in each grid cell on a particular routable layer of the circuit design. For some embodiments, the method 700 is performed once for each different routable layer of the circuit design to count a number of pins on those different routable layers of the circuit design. Like the method 600 of FIG. 6, the method 700 can be performed as part of a global routing process with respect to a circuit design (e.g., by an EDA software system). An operation of the method 700 may be performed by a hardware processor.

The method 700 as illustrated begins with operation 702 accessing a list of grid cells as input and, at operation 704, letting variable $p_i$ represent the $i^{th}$ pin at a specific location (x and y coordinates) on a layer of the circuit design. The method 700 continues with operation 706 initially setting variable i to a value of 1. The method 700 continues with operation 708 determining whether the pin represented by $p_i$ is disposed on a mutable layer z of the circuit design. If yes, the method 700 continues to operation 710; otherwise the method 700 continues to operation 720. Operation 720 determines whether the pin represented by $p_i$ is the last in the list of pins accessed at operation 702. If yes, the method 700 finishes at operation 722; otherwise the method 700 continues to operation 716. Operation 716 increments variable i by a value of 1, and returns to operation 708.

If the method 700 continues to operation 710, operation 710 gets a location (x and y coordinates) for the pin (the pin determined to be disposed on routable layer z at operation 708) and gets a grid cell at the location. The method 700 continues with operation 712 letting variable $p_{x,y,z}$ be the number of pins in the grid cell at the location on routable layer z. The method 700 continues with operation 714 incrementing $p_{x,y,z}$ by a value of 1, From operation 714, the method 700 continues to operation 720.

Referring now to FIG. 8, the flowchart illustrates the example method 800 for determining a set of capacity values (that corresponds to the set of grid cells) based on a set of pin counts and a minimum capacity value for each grid cell in the set of grid cells, according to some embodiments. In particular, the method 800 can determine a given capacity value (in the set of capacity values) for each $i^{th}$ grid cell in the set of grid cells on a routable layer z of a circuit design. For some embodiments, the method 800 is performed once for each given routable layer of the circuit design. Like the method 600 of FIG. 6, the method 800 can be performed as part of a global routing process with respect to a circuit design (e.g., by an EDA software system). An operation of the method 800 may be performed by a hardware processor.

The method 800 as illustrated starts at operation 802 accessing a list of grid cells as input and, at operation 804, letting variable $g_i$ represent the $i^{th}$ grid cell at a specific location (x and y coordinates) on a routable layer z of the circuit design. The method 800 continues with operation 806 initially setting variable i to a value of 1.

The method 800 continues with operation 808 determining whether the grid cell represented by $g_i$ has pins on routable layer z of the circuit design. If yes, the method 800 continues to operation 810; otherwise the method 800 continues to operation 820. Operation 820 determines whether the grid cell represented by $g_i$ is the last in the list of grid cells accessed at operation 802. If yes, the method 800 finishes at operation 822; otherwise the method 800 continues to operation 816. Operation 816 increments variable i by a value of 1, and returns to operation 808.

If the method 800 continues to operation 810, operation 810 lets $p_{i,z}$ be the number of pins in grid cell $g_i$ on routable layer z. For some embodiments, the number of pins in grid cell $g_i$ is obtained from the set of pin counts generated as described herein (e.g., generated by the method 700 of FIG. 7). The method 800 continues with operation 812 letting variable $c_{x,y,z}$ be the capacity value of the grid cell $g_i$ at the location on routable layer z. The method 800 continues with operation 814 determining the capacity value $c_{x,y,z}$ of the grid cell $g_i$ by the following Equation 2, $$c_{x,y,z} = \text{MAX}(\theta, c_{x,y,z} - (\alpha \times p_{i,z})),$$

where α represents a multiplier value that can be tuned by a user (e.g., EDA user) and θ represents a minimum capacity value that should remain in a grid cell, which can also be selected by the user or set to a default. Eventually, the method 800 continues to operation 820.

Figure 9:
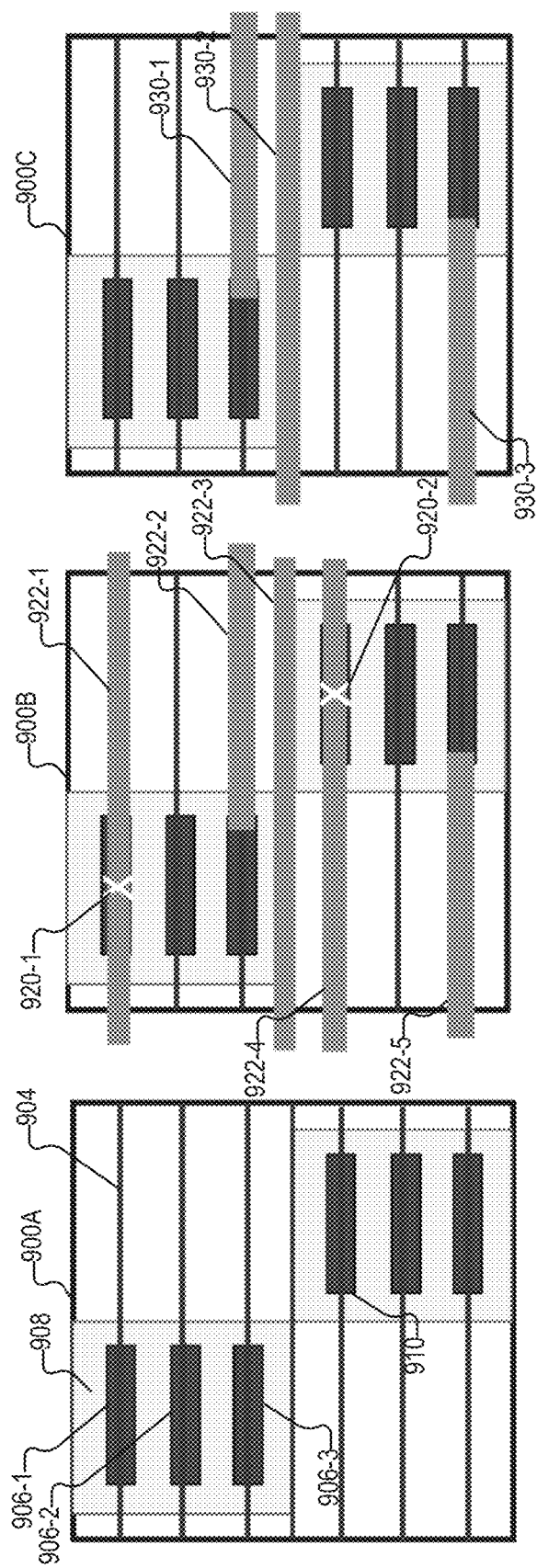
FIG. 9 is a diagram illustrating an example grid cell that can be processed by some embodiments.

FIG. 9 is a diagram illustrating an example grid cell 900 that can be processed by some embodiments, such as the method 600 of FIG. 6. In particular, 900A, 900B, 900C are representations of the grid cell 900 with respect to example pin shapes and short violations. As shown with respect to grid cell 900A, the grid cell 900 comprises tracks (e.g., track 904), circuit elements (e.g., circuit element 908), and example pin shapes (e.g., pin shapes 906-1, 906-2, 906-3 of the circuit element 908). Of the seven tracks illustrated with respect to the grid cell 900, one track is totally blocked and six tracks are at least partially used by pin shapes.

As shown with respect to grid cell 900B, wires 922-1, 922-2, 922-3, 922-4, 922-5 are routed through the grid cell 900 and assigned to tracks of the grid cell 900. As also shown, the routing of wire 922-1 through the grid cell 900B causes a short violation at 920-1 with respect to pin shape 906-1, and the routing of wire 922-4 through the grid cell 900B causes a short violation at 920-2 with respect to pin shape 910.

Grid cell 900C can represent the grid cell 900 that results after performing circuit design routing (e.g., global routing) in accordance with some embodiments described herein, such as the method 600 of FIG. 6. As shown with respect to grid cell 900C, wires 930-1, 930-2, 930-3 are routed through the grid cell 900 and assigned to tracks of the grid cell 900 without short violations.

Figure 10:
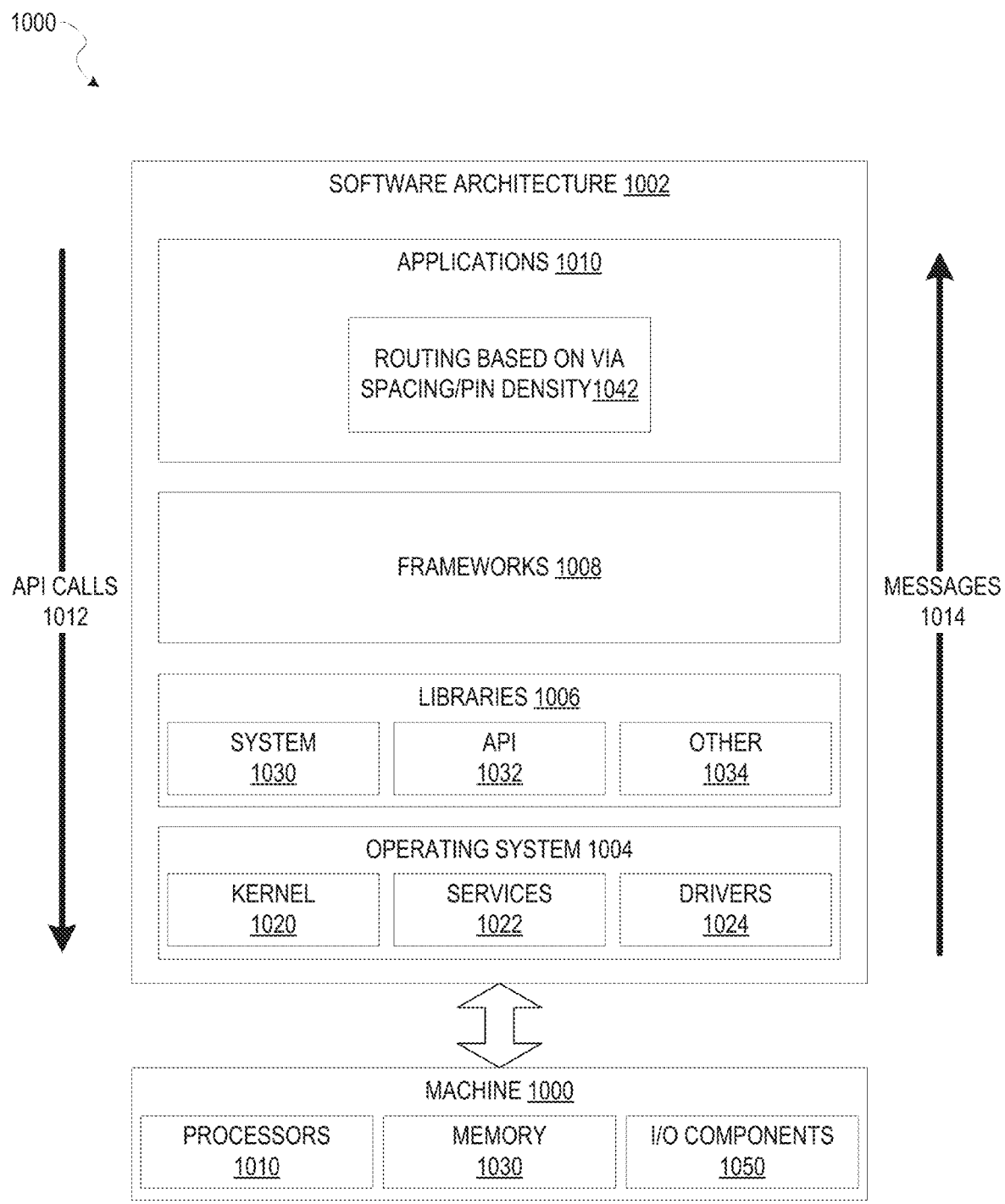
FIG. 10 is a block diagram illustrating an example of a software architecture that may be operating on an electronic design automation (EDA) computing device and may be used with methods for routing a network of a circuit design based on at least one of via spacing or pin density, according to some embodiments.

FIG. 10 is a block diagram 1000 illustrating an example of a software architecture 1002 that may be operating on an EDA computer and may be used with methods for routing a network of a circuit design based on at least one of via spacing or pin density, according to some embodiments. The software architecture 1002 can be used as an EDA computing device to implement any of the methods described above. Aspects of the software architecture 1002 may, in various embodiments, be used to store circuit designs, and to facilitate generation of a circuit design in an EDA environment by routing a network of a circuit design based on at least one of via spacing or pin density, from which physical devices may be generated.

FIG. 10 is merely a non-limiting example of a software architecture 1002, and it will be appreciated that many other architectures can be implemented to facilitate the functionality described herein. In various embodiments, the software architecture 1002 is implemented by hardware such as a machine 1100 of FIG. 11 that includes processors 1110, memory 1130, and I/O components 1150. In this example, the software architecture 1002 can be conceptualized as a stack of layers where each layer may provide a particular functionality. For example, the software architecture 1002 includes layers such as an operating system 1004, libraries 1006, software frameworks 1008, and applications 1010. Operationally, the applications 1010 invoke application programming interface (API) calls 1012 through the software stack and receive messages 1014 in response to the API calls 1012, consistent with some embodiments. In various embodiments, any client device, any server computer of a server system, or any other device described herein may operate using elements of the software architecture 1002. An EDA computing device described herein may additionally be implemented using aspects of the software architecture 1002, with the software architecture 1002 adapted for operating to circuit design routing in any manner described herein.

In some embodiments, an EDA application of the applications 1010 performs circuit design routing according to embodiments described herein using various modules within the software architecture 1002. For example, in some embodiments, an EDA computing device similar to the machine 1100 includes the memory 1130 and the one or more processors 1110. The processors 1110 also implement a (circuit design) routing based on via spacing/pin density module 1042 for routing a network of a circuit design based on at least one of via spacing or pin density, in accordance with various embodiments described herein.

In various other embodiments, rather than being implemented as modules of the one or more applications 1010, the routing based on via spacing/pin density module 1042 may be implemented using elements of the libraries 1006, the operating system 1004, or the software frameworks 1008.

In various implementations, the operating system 1004 manages hardware resources and provides common services. The operating system 1004 includes, for example, a kernel 1020, services 1022, and drivers 1024. The kernel 1020 acts as an abstraction layer between the hardware and the other software layers, consistent with some embodiments. For example, the kernel 1020 provides memory management, processor management (e.g., scheduling), component management, networking, and security settings, among other functionality. The services 1022 can provide other common services for the other software layers. The drivers 1024 are responsible for controlling or interfacing with the underlying hardware, according to some embodiments. For instance, the drivers 1024 can include display drivers, signal-processing drivers to optimize modeling computation, memory drivers, serial communication drivers (e.g., Universal Serial Bus (USB) drivers), WI-FIR drivers, audio drivers, power management drivers, and so forth.

In some embodiments, the libraries 1006 provide a low-level common infrastructure utilized by the applications 1010. The libraries 1006 can include system libraries 1030 such as libraries of blocks for use in an EDA environment or other libraries that can provide functions such as memory allocation functions, string manipulation functions, mathematic functions, and the like. In addition, the libraries 1006 can include API libraries 1032 such as media libraries (e.g., libraries to support presentation and manipulation of various media formats such as Joint Photographic Experts Group (JPEG or JPG), or Portable Network Graphics (PNG)), graphics libraries (e.g., an OpenGL framework used to render in two dimensions (2D) and three dimensions (3D) in a graphic context on a display), database libraries (e.g., SQLite to provide various relational database functions), web libraries (e.g., WebKit to provide web browsing functionality), and the like. The libraries 1006 may also include other libraries 1034.

The software frameworks 1008 provide a high-level common infrastructure that can be utilized by the applications 1010, according to some embodiments. For example, the software frameworks 1008 provide various graphic user interface (GUI) functions, high-level resource management, high-level location services, and so forth. The software frameworks 1008 can provide a broad spectrum of other APIs that can be utilized by the applications 1010, some of which may be specific to a particular operating system 1004 or platform. In various embodiments, the systems, methods, devices, and instructions described herein may use various files, macros, libraries, and other elements of an EDA design environment to implement routing a network of a circuit design based on at least one of via spacing or pin density as described herein. This includes analysis of input design files for an integrated circuit design, along with any element of hierarchical analysis that may be used as part of or along with the embodiments described herein. While netlist files, library files, SDC and view definition files are examples that may operate within the software architecture 1002, it will be apparent that other files and structures may provide a similar function, in various embodiments.

Certain embodiments are described herein as including logic or a number of components, modules, elements, or mechanisms. Such modules can constitute either software modules (e.g., code embodied on a machine-readable medium or in a transmission signal) or hardware modules. A "hardware module" is a tangible unit capable of performing certain operations and can be configured or arranged in a certain physical manner. In various embodiments, one or more computer systems (e.g., a standalone computer system, a client computer system, or a server computer system) or one or more hardware modules of a computer system (e.g., a processor or a group of processors) are configured by software (e.g., an application or application portion) as a hardware module that operates to perform certain operations as described herein.

In some embodiments, a hardware module is implemented mechanically, electronically, or any suitable combination thereof. For example, a hardware module can include dedicated circuitry or logic that is permanently configured to perform certain operations. For example, a hardware module can be a special-purpose processor, such as a field-programmable gate array (FPGA) or an application-specific integrated circuit (ASIC). A hardware module may also include programmable logic or circuitry that is temporarily configured by software to perform certain operations. For example, a hardware module can include software encompassed within a general-purpose processor or other programmable processor. It will be appreciated that the decision to implement a hardware module mechanically, in dedicated and permanently configured circuitry, or in temporarily configured circuitry (e.g., configured by software) can be driven by cost and time considerations.

Accordingly, the phrase "module" should be understood to encompass a tangible entity, be that an entity that is physically constructed, permanently configured (e.g., hardwired), or temporarily configured (e.g., programmed) to operate in a certain manner or to perform certain operations described herein. Considering embodiments in which hardware modules are temporarily configured (e.g., programmed), each of the hardware modules need not be configured or instantiated at any one instance in time. For example, where a hardware module comprises a general-purpose processor configured by software to become a special-purpose processor, the general-purpose processor may be configured as respectively different special-purpose processors (e.g., comprising different hardware modules) at different times. Software can accordingly configure a particular processor or processors, for example, to constitute a particular hardware module at one instance of time and to constitute a different hardware module at a different instance of time.

Hardware modules can provide information to, and receive information from, other hardware modules. Accordingly, the described hardware modules can be regarded as being communicatively coupled. Where multiple hardware modules exist contemporaneously, communications can be achieved through signal transmission (e.g., over appropriate circuits and buses) between or among two or more of the hardware modules. In embodiments in which multiple hardware modules are configured or instantiated at different times, communications between or among such hardware modules may be achieved, for example, through the storage and retrieval of information in memory structures to which the multiple hardware modules have access. For example, one hardware module performs an operation and stores the output of that operation in a memory device to which it is communicatively coupled. A further hardware module can then, at a later time, access the memory device to retrieve and process the stored output. Hardware modules can also initiate communications with input or Output devices, and can operate on a resource (e.g., a collection of information).

The various operations of example methods described herein can be performed, at least partially, by one or more processors that are temporarily configured (e.g., by software) or permanently configured to perform the relevant operations. Whether temporarily or permanently configured, such processors constitute processor-implemented modules that operate to perform one or more operations or functions described herein. As used herein, "processor-implemented module" refers to a hardware module implemented using one or more processors.

Similarly, the methods described herein can be at least partially processor-implemented, with a particular processor or processors being an example of hardware. For example, at least some of the operations of a method can be performed by one or more processors or processor-implemented modules. Moreover, the one or more processors may also operate to support performance of the relevant operations in a "cloud computing" environment or as a "software as a service" (SaaS). For example, at least some of the operations may be performed by a group of computers examples of machines 1100 including processors 1110), with these operations being accessible via a network (e.g., the Internet) and via one or more appropriate interfaces (e.g., an API). In certain embodiments, for example, a client device may relay or operate in communication with cloud computing systems, and may access circuit design information in a cloud environment.

The performance of certain of the operations may be distributed among the processors, not only residing within a single machine 1100, but deployed across a number of machines 1100. In some embodiments, the processors 1110 or processor-implemented modules are located in a single geographic location (e.g., within a home environment, an office environment, or a server farm). In some other embodiments, the processors or processor-implemented modules are distributed across a number of geographic locations.

Figure 11:
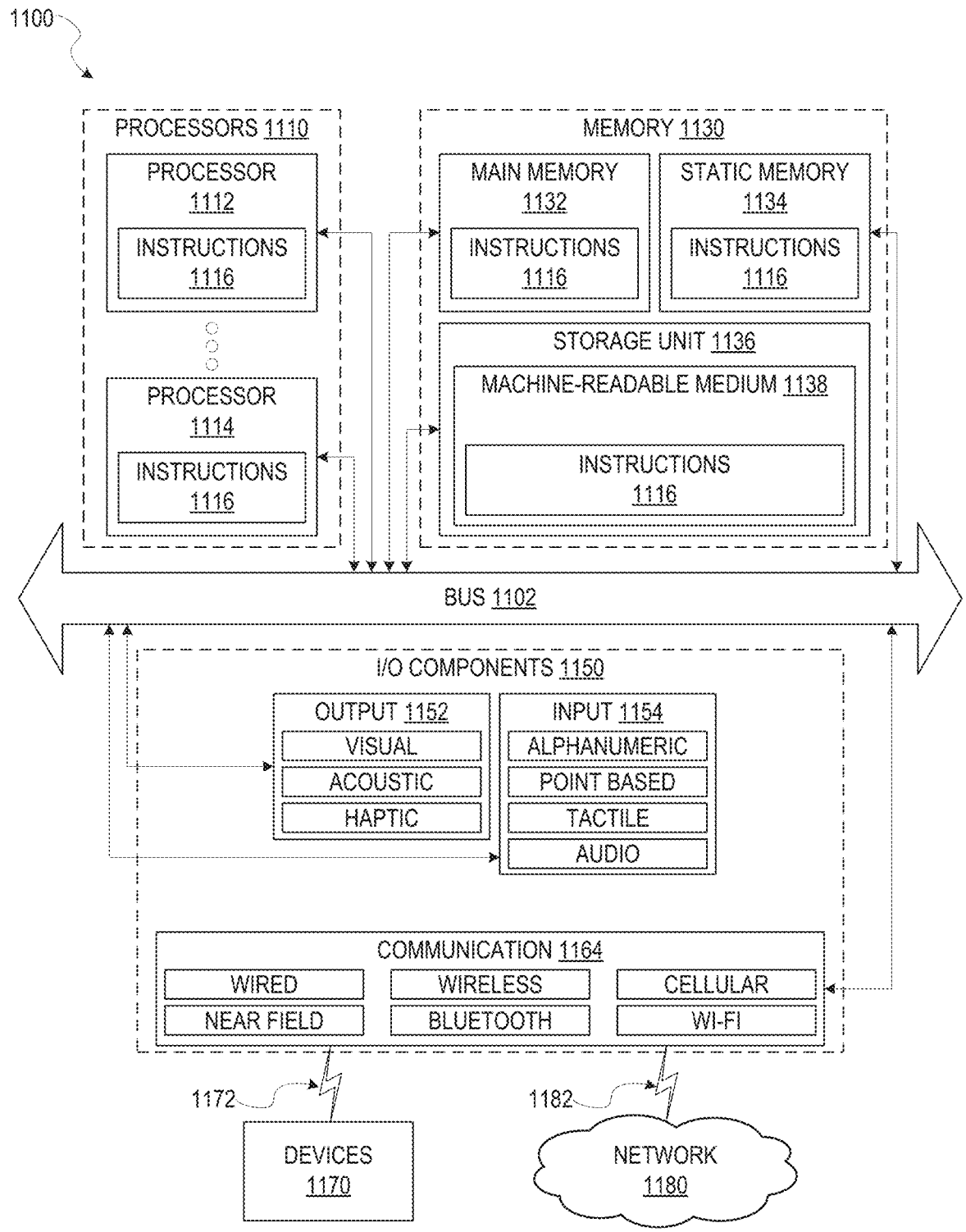
FIG. 11 is a diagram representing a machine in the form of a computer system within which a set of instructions are executed, causing the machine to perform any one or more of the methods discussed herein, according to some embodiments.

FIG. 11 is a diagrammatic representation of the machine 1100 in the form of a computer system within which a set of instructions may be executed for causing the machine 1100 to perform any one or more of the methodologies discussed herein, according to some embodiments. FIG. 11 shows components of the machine 1100, which is, according to some embodiments, able to read instructions from a machine-readable medium (e.g., a machine-readable storage medium) and perform any one or more of the methodologies discussed herein. Specifically, FIG. 11 shows a diagrammatic representation of the machine 1100 in the example form of a computer system, within which instructions 1116 (e.g., software, a program, an application, an applet, an app, or other executable code) for causing the machine 1100 to perform any one or more of the methodologies discussed herein can be executed. In alternative embodiments, the machine 1100 operates as a standalone device or can be coupled (e.g., networked) to other machines. In a networked deployment, the machine 1100 may operate in the capacity of a server machine or a client machine in a server-client network environment, or as a peer machine in a peer-to-peer (or distributed) network environment. The machine 1100 can comprise, but not be limited to, a server computer, a client computer, a personal computer (PC), a tablet computer, a laptop computer, a netbook, or any machine capable of executing the instructions 1116, sequentially or otherwise, that specify actions to be taken by the machine 1100. Further, while only a single machine 1100 is illustrated, the term "machine" shall also be taken to include a collection of machines 1100 that individually or jointly execute the instructions 1116 to perform any one or more of the methodologies discussed herein.

In various embodiments, the machine 1100 comprises processors 1110, memory 1130, and I/O components 1150, which can be configured to communicate with each other via a bus 1102, in some embodiments, the processors 1110 (e.g., a central processing unit (CPU), a reduced instruction set computing (RISC) processor, a complex instruction set computing (CISC) processor, a graphics processing unit (GPU), a digital signal processor (DSP), an ASIC, a radio-frequency integrated circuit (RFIC), another processor, or any suitable combination thereof) include, for example, a processor 1112 and a processor 1114 that may execute the instructions 1116. The term "processor" is intended to include multi-core processors 1110 that may comprise two or more independent processors 1112, 1114 (also referred to as "cores") that can execute the instructions 1116 contemporaneously. Although FIG. 11 shows multiple processors 1110, the machine 1100 may include a single processor 1112 with a single core, a single processor 1112 with multiple cores (e.g., a multi-core processor 1112), multiple processors 1110 with a single core, multiple processors 1110 with multiple cores, or any combination thereof.

The memory 1130 comprises a main memory 1132, a static memory 1134, and a storage unit 1136 accessible to the processors 1110 via the bus 1102, according to some embodiments. The storage unit 1136 can include a machine-readable medium 1138 on which are stored the instructions 1116 embodying any one or more of the methodologies or functions described herein. The instructions 1116 can also reside, completely or at least partially, within the main memory 1132, within the static memory 1134, within at least one of the processors 1110 (e.g., within the processor's cache memory), or any suitable combination thereof, during execution thereof by the machine 1100. Accordingly, in various embodiments, the main memory 1132, the static memory 1134, and the processors 1110 are considered machine-readable media 1138.

As used herein, the term "memory" refers to a machine-readable medium 1138 able to store data temporarily or permanently and may be taken to include, but not be limited to, random-access memory (RAM), read-only memory (ROM), buffer memory, flash memory, and cache memory. While the machine-readable medium 1138 is shown, in some embodiments, to be a single medium, the term "machine-readable medium" should be taken to include a single medium or multiple media (e.g., a centralized or distributed database, or associated caches and servers) able to store the instructions 1116. The term "machine-readable medium" shall also be taken to include any medium, or combination of multiple media, that is capable of storing instructions (e.g., the instructions 1116) for execution by a machine (e.g., the machine 1100), such that the instructions, when executed by one or more processors of the machine (e.g., the processors 1110), cause the machine to perform any one or more of the methodologies described herein. Accordingly, a "machine-readable medium" refers to a single storage apparatus or device, as well as "cloud-based" storage systems or storage networks that include multiple storage apparatus or devices. The term "machine-readable medium" shall accordingly be taken to include, but not be limited to, one or more data repositories in the form of a solid-state memory (e.g., flash memory), an optical medium, a magnetic medium, other non-volatile memory (e.g., erasable programmable read-only memory (EPROM)), or any suitable combination thereof. The term "machine-readable medium" specifically excludes non-statutory signals per se.

The I/O components 1150 include a wide variety of components to receive input, provide output, produce output, transmit information, exchange information, capture measurements, and so on. In general, it will be appreciated that the I/O components 1150 can include many other components that are not shown in FIG. 11. The I/O components 1150 are grouped according to functionality merely for simplifying the following discussion, and the grouping is in no way limiting. In various embodiments, the I/O components 1150 include output components 1152 and input components 1154. The output components 1152 include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor), other signal generators, and so forth. The input components 1154 include alphanumeric input components (e.g.; a keyboard, a touch screen configured to receive alphanumeric input, a photo-optical keyboard, or other alphanumeric input components), point-based input components (e.g., a mouse, a touchpad, a trackball, or other pointing instruments), tactile input components (e.g., a physical button, a touch screen that provides location and force of touches or touch gestures, or other tactile input components), audio input components (e.g., a microphone), and the like.

In some embodiments, outputs from an EDA computing device may include design documents, files for additional steps in a design flow, or outputs for circuit fabrication. As described herein, "constraints," "requirements," "design elements," and other aspects of a circuit design refer to selectable values that are set as part of the design of a circuit. Such design constraints, requirements, or elements may be adjusted by a system operator or circuit designer to suit the particular goals of a project or circuit that results from the operations described herein.

Communication can be implemented using a wide variety of technologies. The I/O components 1150 may include communication components 1164 operable to couple the machine 1100 to a network 1180 or devices 1170 via a coupling 1182 and a coupling 1172, respectively. For example, the communication components 1164 include a network interface component or another suitable device to interface with the network 1180. In further examples, the communication components 1164 include wired communication components, wireless communication components, cellular communication components, near field communication (NFC) components, BLUETOOTH® components (e.g., BLUETOOTH® Low Energy), WI-FI® components, and other communication components to provide communication via other modalities. The devices 1170 may be another machine or any of a wide variety of peripheral devices (e.g., a peripheral device coupled via a USB).

In various embodiments, one or more portions of the network 1180 can be an ad hoc network, an intranet, an extranet, a virtual private network (VPN), a local area network (LAN), a wireless LAN (WLAN), a wide area network (WAN), a wireless WAN (WWAN), a metropolitan area network (MAN); the Internet, a portion of the Internet, a portion of the public switched telephone network (PSTN), a plain old telephone service (POTS) network, a cellular telephone network; a wireless network; a WI-FI® network, another type of network, or a combination of two or more such networks. For example, the network 1180 or a portion of the network 1180 may include a wireless or cellular network, and the coupling 1182 may be a Code Division Multiple Access (CDMA) connection, a Global System for Mobile communications (GSM) connection, or another type of cellular or wireless coupling.

Furthermore, the machine-readable medium 1138 is non-transitory (in other words, not having any transitory signals) in that it does not embody a propagating signal. However, labeling the machine-readable medium 1138 "non-transitory" should not be construed to mean that the machine-readable medium 1138 is incapable of movement; the machine-readable medium 1138 should be considered as being transportable from one physical location to another. Additionally, since the machine-readable medium 1138 is tangible, the machine-readable medium 1138 may be considered to be a machine-readable device.

Throughout this specification, plural instances may implement components; operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to some embodiments, various modifications and changes may be made to these embodiments without departing from the broader scope of embodiments of the present disclosure.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The detailed description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. The terms "a" or "an" should be read as meaning "at least one," "one or more," or the like. The use of words and phrases such as "one or more," "at least," "but not limited to," or other like phrases shall not be read to mean that the narrower case is intended or required in instances where such broadening phrases may be absent.

Boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The description above includes systems, methods, devices, instructions, and computer media e.g., computing machine program products) that embody illustrative embodiments of the disclosure. In the description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, protocols, structures, and techniques are not necessarily shown in detail.

What is claimed is:

1. A method comprising:
   accessing, by a hardware processor, wiring data that describes a set of wires for a circuit design;
   generating, by the hardware processor, a set of via counts that corresponds to a set of grid cells for the circuit design by determining a count of vias in each grid cell of the set of grid cells based on the wiring data;
   determining, by the hardware processor, a via count threshold for each grid cell in the set of grid cells based on a via spacing rule;
   determining, by the hardware processor, a set of demand values that corresponds to the set of grid cells based on the set of via counts and the via count threshold;
   generating, by the hardware processor, congestion map data for the circuit design based on the set of demand values, the congestion map data describing routing congestion for the set of grid cells; and
   routing a network of the circuit design based on the congestion map data.

2. The method of claim 1, wherein the set of grid cells comprises grid cells for a plurality of layers of the circuit design.

3. The method of claim 1, wherein the generating the congestion map data for the circuit design based on the set of demand values comprises:
   accessing prior congestion map data for the set of grid cells; and
   generating the congestion map data by updating the prior congestion map data based on the set of demand values.

4. The method of claim 3, wherein the prior congestion map data comprises data describing a set of existing demand values previously determined for the set of grid cells, and wherein the updating the prior congestion map data based on the set of demand values comprises:
   adding a value, based on a given demand value in the set of demand values, to a given existing demand value in the set of existing demand values to generate an updated demand value for a given grid cell in the set of grid cells, the given demand value and the given existing demand value being associated with the given grid cell.

5. The method of claim 1, wherein the determining the via count threshold for each grid cell in the set of grid cells based on the via spacing rule comprises:
   determining a number of available intersections in each grid cell in the set of grid cells;
   determining a number of blocked intersections per via based on the via spacing rule; and
   determining the via count threshold based on the number of available intersections and the number of blocked intersections.

6. The method of claim 5, wherein the determining the via count threshold based on the number of available intersections and the number of blocked intersections comprises dividing the number of available intersections by the number of blocked intersections.

7. The method of claim 1, wherein the determining the set of demand values that corresponds to the set of grid cells based on the set of via counts and the via count threshold comprises:
   for a given demand value, in the set of demand values, corresponding to a given grid cell in the set of grid cells:
   determining the given demand value by subtracting the via count threshold from a via count, in the set of via counts, corresponding to the given grid cell.

8. The method of claim 1, wherein a given demand value, in the set of demand values, corresponds to a given grid cell in the set of grid cells, and the given demand value represents an additional resource demand value caused by one or more vias in the given grid cell.

9. The method of claim 1, wherein the method is performed as part of performing global routing on the network of the circuit design.

10. A non-transitory computer-readable medium comprising instructions that, when executed by a hardware processor of a device, cause the device to perform operations comprising:
    accessing wiring data that describes a set of wires for a circuit design;
    generating a set of via counts that corresponds to a set of grid cells for the circuit design by determining a count of vias in each grid cell of the set of grid cells based on the wiring data;
    determining a set of demand values that corresponds to the set of grid cells based on the set of via counts and a via count threshold, the via count threshold being based on a via spacing rule;
    generating congestion map data for the circuit design based on the set of demand values, the congestion map data describing routing congestion for the set of grid cells; and
    routing a network of the circuit design based on the congestion map data.

11. The non-transitory computer-readable medium of claim 10, wherein the operations further comprise:
    determining the via count threshold for each grid cell in the set of grid cells based on the via spacing rule by:
    determining a number of available intersections in each grid cell in the set of grid cells;
    determining a number of blocked intersections per via based on the via spacing rule; and
    determining the via count threshold based on the number of available intersections and the number of blocked intersections.

12. The non-transitory computer-readable medium of claim 11, wherein the determining the via count threshold based on the number of available intersections and the number of blocked intersections comprises dividing the available intersections by the number of blocked intersections.

13. The non-transitory computer-readable medium of claim 10, wherein the determining the set of demand values that corresponds to the set of grid cells based on the set of via counts and the via count threshold comprises:
    for a given demand value, in the set of demand values, corresponding to a given grid cell in the set of grid cells:

determining the given demand value by subtracting the via count threshold from a via count, in the set of via counts, corresponding to the given grid cell.

14. The non-transitory computer-readable medium of claim 10, wherein a given demand value, in the set of demand values, corresponds to a given grid cell in the set of grid cells, and the given demand value represents an additional resource demand value caused by one or more vias in the given grid cell.

* * * * *